United States Patent
Liu et al.

(10) Patent No.: US 7,928,499 B2
(45) Date of Patent: Apr. 19, 2011

(54) PROFILE OF FLASH MEMORY CELLS

(75) Inventors: Shih-Chang Liu, Alian Township (TW); Chu-Wei Chang, Pingjhen (TW); Chi-Hsin Lo, Zhubei (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1076 days.

(21) Appl. No.: 11/715,229

(22) Filed: Mar. 7, 2007

(65) Prior Publication Data

US 2008/0217675 A1    Sep. 11, 2008

(51) Int. Cl.
*H01L 29/788* (2006.01)

(52) U.S. Cl. ................... 257/321; 257/E27.103

(58) Field of Classification Search .......... None
See application file for complete search history.

(56) References Cited

U.S. PATENT DOCUMENTS

| | | | |
|---|---|---|---|
| 5,847,427 A * | 12/1998 | Hagiwara | 257/324 |
| 6,114,723 A * | 9/2000 | Leu | 257/316 |
| 6,259,131 B1 * | 7/2001 | Sung et al. | 257/315 |
| 6,403,419 B1 * | 6/2002 | Kim et al. | 438/257 |
| 6,693,009 B1 * | 2/2004 | Kim et al. | 438/257 |
| 6,894,343 B2 | 5/2005 | Harari et al. | |
| 2002/0008277 A1 * | 1/2002 | Chen | 257/315 |
| 2004/0065917 A1 * | 4/2004 | Fan et al. | 257/315 |
| 2004/0238881 A1 * | 12/2004 | Ozawa | 257/316 |
| 2005/0012140 A1 * | 1/2005 | Shin et al. | 257/315 |
| 2006/0120194 A1 * | 6/2006 | Shin et al. | 365/222 |
| 2007/0122968 A1 * | 5/2007 | Sim et al. | 438/243 |
| 2007/0278531 A1 * | 12/2007 | Choi et al. | 257/213 |
| 2008/0073689 A1 * | 3/2008 | Wang et al. | 257/314 |
| 2008/0308858 A1 * | 12/2008 | Sandhu et al. | 257/316 |

* cited by examiner

*Primary Examiner* — Kiesha R Bryant
*Assistant Examiner* — Igwe U Anya
(74) *Attorney, Agent, or Firm* — Slater & Matsil, L.L.P.

(57) ABSTRACT

A semiconductor structure includes a semiconductor substrate; a tunneling layer on the semiconductor substrate; a source region adjacent the tunneling layer; and a floating gate on the tunneling layer. The floating gate comprises a first edge having an upper portion and a lower portion, wherein the lower portion is recessed from the upper portion. The semiconductor structure further includes a blocking layer on the floating gate, wherein the blocking layer has a first edge facing a same direction as the first edge of the floating gate.

16 Claims, 10 Drawing Sheets

US 7,928,499 B2

PROFILE OF FLASH MEMORY CELLS

TECHNICAL FIELD

This invention relates generally to semiconductor devices, and more particularly to the structure and manufacturing methods of flash memory cells.

BACKGROUND

Flash memories have become increasingly popular in recent years. A typical flash memory comprises a memory array having a large number of memory cells arranged in blocks. Each of the memory cells is fabricated as a field-effect transistor having a control gate and a floating gate. The floating gate is capable of holding charges and is separated from source and drain regions contained in a substrate by a layer of thin oxide. Each of the memory cells can be electrically charged by injecting electrons from the substrate through the oxide layer onto the floating gate. The charges can be removed from the floating gate by tunneling the electrons to the source region or an erase gate during an erase operation. The data in flash memory cells are thus determined by the presence or absence of charges in the floating gates.

FIG. 1 illustrates two exemplary flash memory cells 2 and 20, wherein flash memory cells 2 and 20 share common source region 16 and common erase gate 18. Flash memory cell 2 includes a floating gate 4, a control gate 6 over and electrically insulated from floating gate 4, and a word-line node 10 over a channel 12 and on sidewalls of floating gate 4 and control gate 6. Word-line 10 controls the conduction of channel 12, which is between bit-line node 14 and source region 16. During a program operation, a voltage is applied between bit-line node 14 and source region 16, with, for example, a bit-line node voltage of about 0.4V and a source voltage of about 5V. Word-line 10 is applied with a voltage of 1.1V to turn on channel 12. Therefore, a current (hence electrons) flows between bit-line node 14 and source region 16. A high voltage, for example, about 10V, is applied on control gate 6, and thus the electrons are programmed into floating gate 4 under the influence of a high electrical field. During an erase operation, a high voltage, for example, 11V, is applied to erase gate 18. Word-line 10 is applied with a low voltage such as 0V, while source region 16, bit-line node 14 and control gate 6 are applied with a voltage of 0V. Electrons in floating gate 4 are thus driven into erase gate 18.

FIGS. 2A and 2B illustrate an intermediate stage in the manufacturing of flash memory cells. FIG. 2A illustrates a top view, while FIG. 2B illustrates a cross-sectional view along a plane crossing line A-A' in FIG. 2A. At this stage, active regions 22 are covered with tunneling layer 23 and floating gate layer 26 (refer to FIG. 2B). Active regions 22 are surrounded by shallow trench isolation (STI) regions 24. Gate stacks 28 are located on floating gate layer 26, wherein each gate stack 28 will be a part of a resulting flash memory. Next, masks are formed, wherein edges 29 (refer to FIG. 2A) of the masks substantially overlap the edges of the respective gate stacks 28. An etch process is then performed to remove the portion of floating gate layer between gate stacks 28. Since the original floating gate layer has four legs, there are four floating gates formed, each separated from others.

With the increasing down-scaling of integrated circuits, the dimensions in the integrated circuits become increasingly smaller. In 90 nm technology, a distance D1 between edge 29 of the mask and the nearest edge of the STI regions can be as small as 300 Å. The precise alignment thus becomes increasingly important. For example, if a misalignment occurs, and the mask shifts to position 30, which is bordered using dashed lines, the floating gate at the upper left corner and the floating gate at the upper right corner will be shorted through a portion 32 of the floating gate layer, which is undesirably not removed due to the masking of the mask. As a result, the resulting memory fails. To make situation worse, STI regions 24 are typically rounded due to optical effects in the photo lithography. This may cause the tips (the portion of STI region 24 close to region 32) of STI regions 24 to recess from the desired position, and thus distance D1 is reduced. Accordingly, the likelihood of having shorted floating gates increases. New memory structures and formation methods are thus needed to solve the above-discussed problems.

SUMMARY OF THE INVENTION

In accordance with one aspect of the present invention, a semiconductor structure includes a semiconductor substrate; a tunneling layer on the semiconductor substrate; a source region adjacent the tunneling layer; and a floating gate on the tunneling layer. The floating gate comprises a first edge having an upper portion and a lower portion, wherein the lower portion is recessed from the upper portion. The semiconductor structure further includes a blocking layer on the floating gate, wherein the blocking layer has a first edge facing a same direction as the first edge of the floating gate.

In accordance with another aspect of the present invention, a semiconductor structure includes a semiconductor substrate; a first tunneling layer and a second tunneling layer on the semiconductor substrate; a common source region between the first and the second tunneling layers, wherein the common source region is in the semiconductor substrate; a first floating gate on the first tunneling layer, wherein the first floating gate has a sidewall facing the common source region, and wherein a lower portion of the first sidewall of the first floating gate is recessed from an upper portion; and a second floating gate on the second tunneling layer, wherein the second floating gate has a sidewall facing the common source region, and wherein a lower portion of the first sidewall of the second floating gate is recessed from an upper portion.

In accordance with yet another aspect of the present invention, a semiconductor structure includes a semiconductor substrate; a first active region in the semiconductor substrate; a second active region in the semiconductor substrate, wherein the first and the second active regions are parallel and spaced apart by an insulation region; a connecting active region perpendicular to the first and the second active regions and connecting a portion of the first active region to a portion of the second active region; a first tunneling layer on the first active region; a first floating gate on the first tunneling layer, wherein the first floating gate has a first edge facing the connecting active region, and wherein a bottom portion of the first edge is recessed from a top portion of the first edge; a second tunneling layer on the second active region; a second floating gate on the second tunneling layer, wherein the first and the second floating gates are disconnected from each other, and wherein the second floating gate has a second edge facing the connecting active region, and wherein a bottom portion of the second edge is recessed from a top portion of the second edge; a blocking layer extending from over the first floating gate to over the second floating gate; and a control gate layer on the blocking layer, the control gate layer extending from over the first floating gate to over the second floating gate.

In accordance with yet another aspect of the present invention, a method of forming a semiconductor structure includes providing a semiconductor substrate; forming a tunneling layer on the semiconductor substrate; forming a source region adjacent the tunneling layer; forming a floating gate on the tunneling layer, wherein the floating gate comprises a first edge having an upper portion and a lower portion; forming a blocking layer on the floating gate, wherein the blocking layer has a first edge facing a same direction as the first edge of the floating gate; and recessing at least the lower portion.

In accordance with yet another aspect of the present invention, a method for forming a semiconductor structure includes forming a semiconductor substrate and forming shallow trench isolation (STI) regions in the semiconductor substrate. The STI regions define a strip of active region in the semiconductor substrate; and a connecting active region perpendicular to the strip of active region and separating the strip of active region into a first active region and a second active region. The method further includes forming a first tunneling layer on the first active region and a second tunneling layer on the second active region; forming a first floating gate leg over the first tunneling layer; forming a second floating gate leg over the second tunneling layer; forming a connecting floating gate portion on the connecting active region; and removing the connecting floating gate portion and portions of the first and the second floating gate legs to form a first floating gate and a second floating gate, wherein each of the first floating gate and a second floating gate comprises a first edge facing the connecting active region, and wherein the first edges of the first floating gate and the second floating gate each comprise a lower portion recessed from an upper portion.

The advantageous features of the present invention include improved erase performance of the resulting flash memory, and reduced likelihood of floating gate shorting.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel flash memory structure and the method of forming the same are provided. The intermediate stages of manufacturing a preferred embodiment of the present invention are illustrated. Throughout the various views and illustrative embodiments of the present invention, like reference numbers are used to designate like elements.

Figure 1:
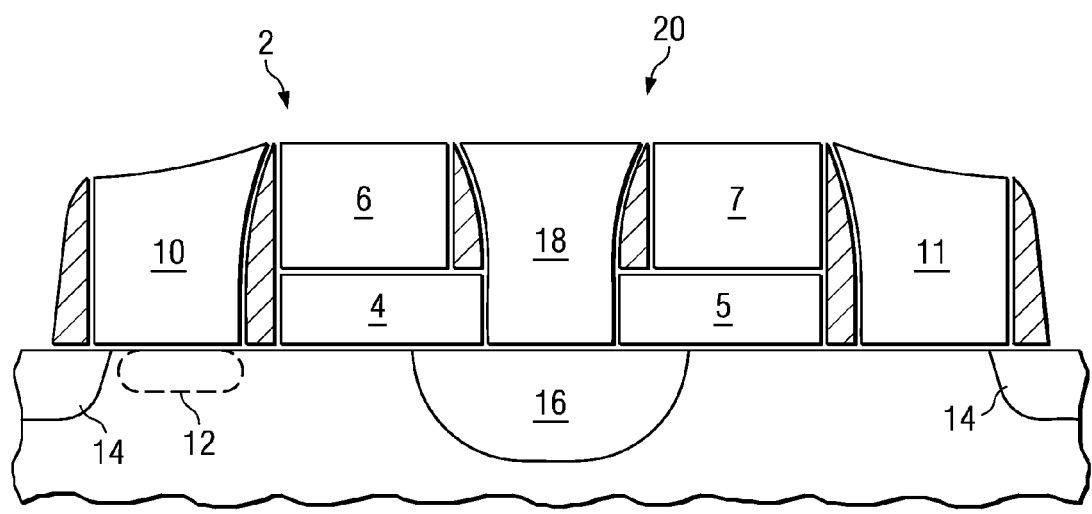
FIG. 1 illustrates a cross-sectional view of two flash memory cells shares a common source and a common erase gate.
Figure 2A:
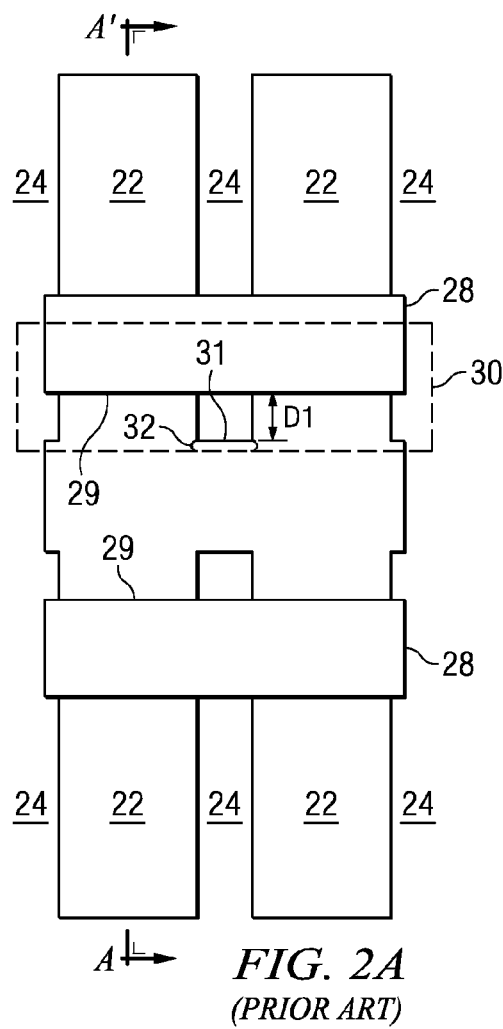
FIGS. 2A and 2B illustrate a top view and a cross-sectional view of an intermediate stage in the formation of flash memory cells, wherein the floating gates of neighboring flash memory cells are shorted due to a misalignment.
Figure 2B:
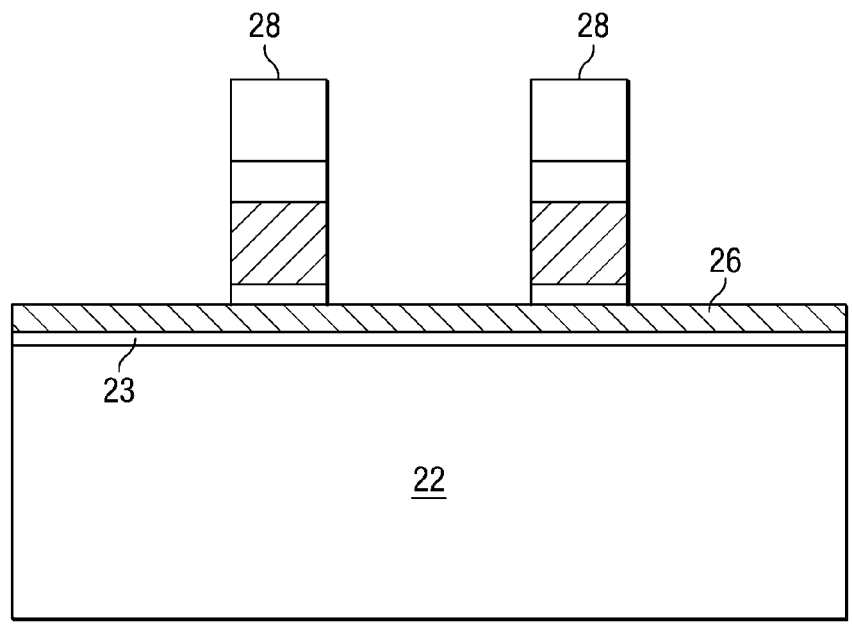
Figure 3A:
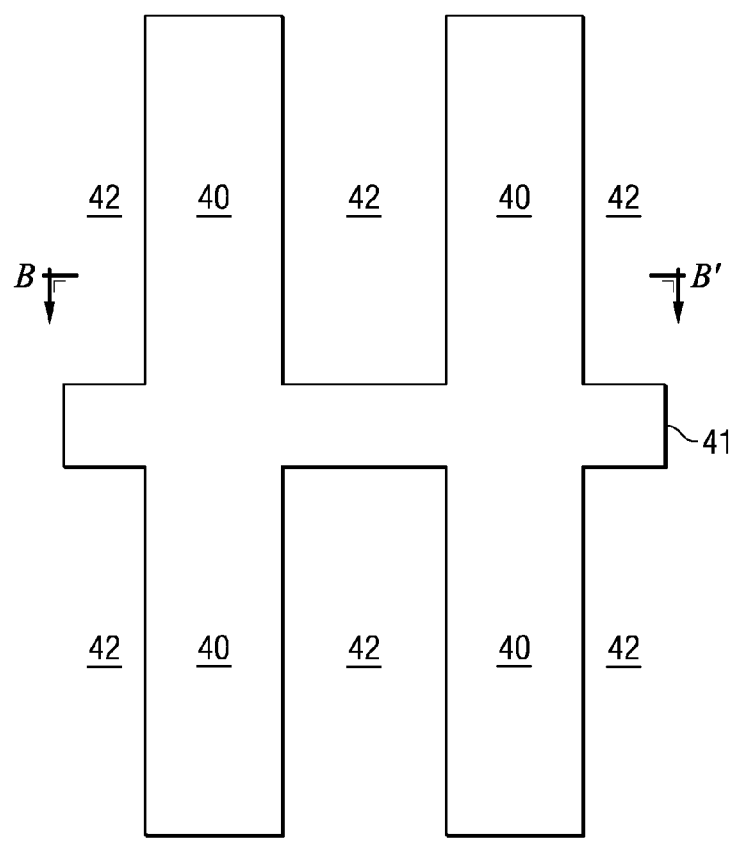
FIGS. 3A through 10C are top views and cross-sectional views of intermediate stages in the manufacturing of an embodiment of the present invention.
Figure 3B:
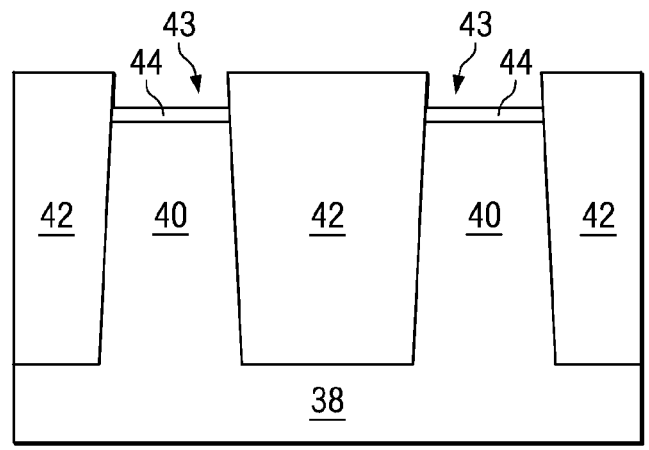

FIGS. 3A and 3B illustrate a starting structure of an embodiment of the present invention. FIG. 3A is a top view of a portion of semiconductor substrate 38 (refer to FIG. 3B), which includes active region 40 defined by shallow trench isolation (STI) regions 42. As is known in the art, semiconductor substrate 38 preferably includes silicon or other known semiconductor materials. Active region 40 includes four legs, each for forming a (top coupling) flash memory cell. The four legs of active region 40 are interconnected by a connecting active region, which is in a direction perpendicular to the legs. FIG. 3B illustrates a cross-sectional view of the structure shown in FIG. 3A, wherein the cross-sectional view is taken along line B-B' in FIG. 3A. The top surface of STI regions 42 is higher than the top surface of active region 40, and hence leaving recesses 43 between STI regions 42. Preferably, tunneling layers 44 are formed on the surface of active region 40, preferably by thermal oxidation. Alternatively, tunneling layers 44 may include nitrides or high-k dielectric materials, which are preferably formed by deposition.

Figure 4A:
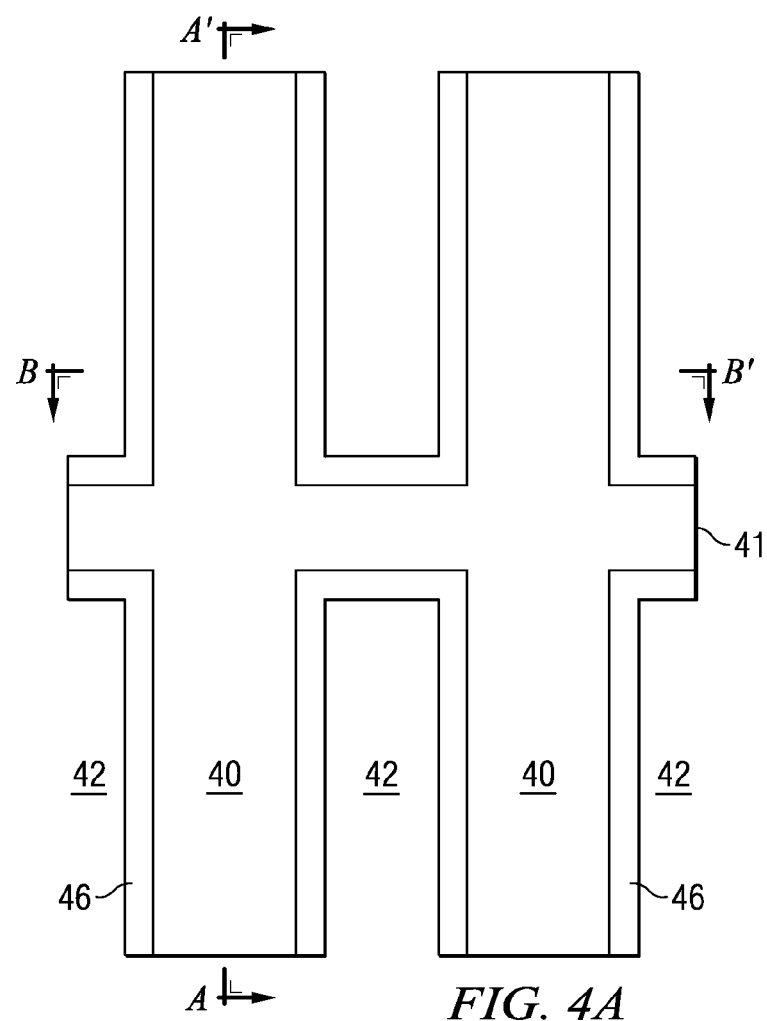
Figure 4B:
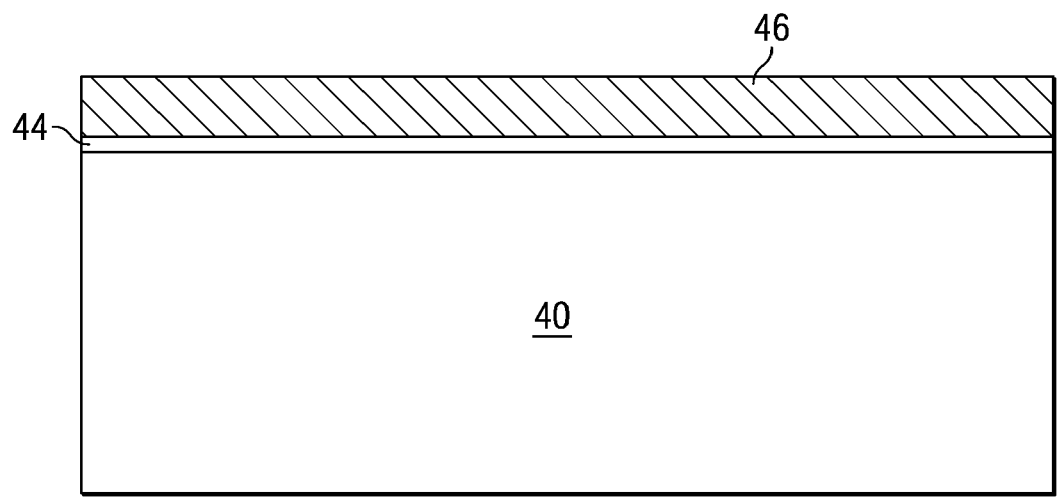
Figure 4C:
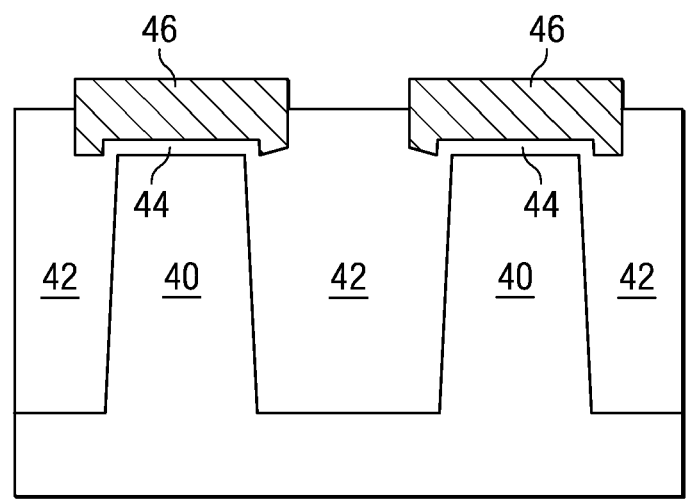

Next, as shown in FIGS. 4A, 4B and 4C, floating gate layer 46 is formed. FIG. 4A is a top view, while FIGS. 4B and 4C illustrate cross-sectional views along planes crossing lines A-A' and B-B', respectfully. Floating gate layer 46 is preferably blanket formed, and a chemical mechanical polish (CMP) is then performed to remove the portions on STI regions 42, leaving only the portions in recesses 43 (refer to FIG. 3B). Floating gate layer 46 is preferably formed of polysilicon. However, other conductive material such as metals, metal silicides, metal nitrides, and dielectric layers having high trapping densities such as silicon nitride, may also be used. In subsequent steps, the top surfaces of STI regions 42 are recessed, as shown in FIG. 4C, so that top surfaces of the remaining floating gate layer 46 are higher than the top surfaces of STI regions 42.

Figure 5A:
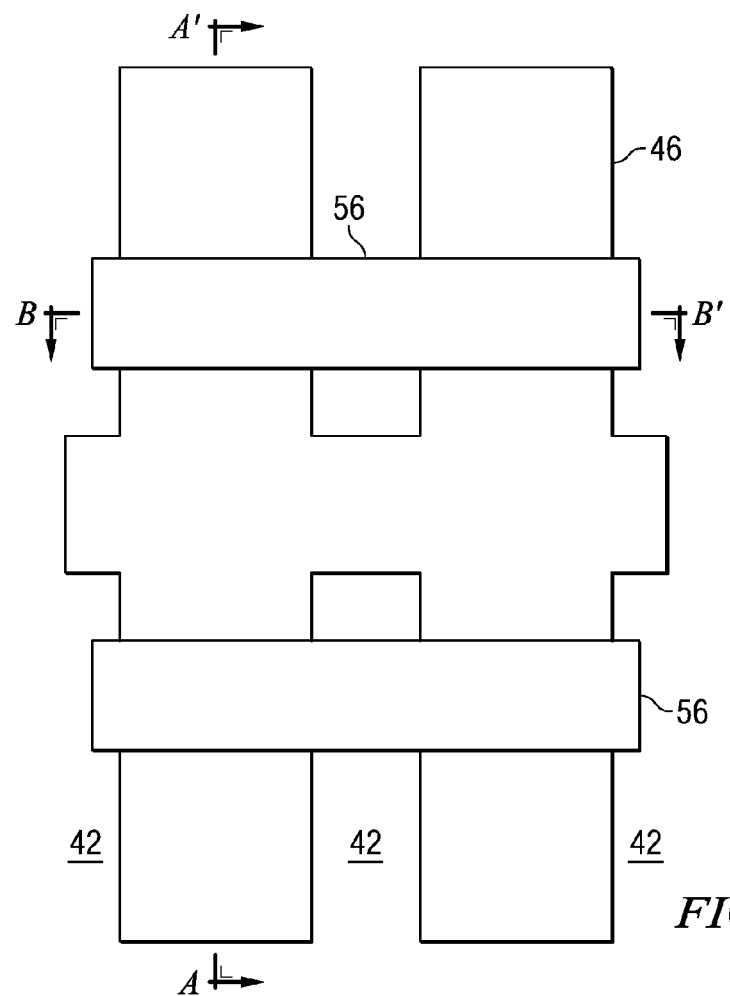
Figure 5B:
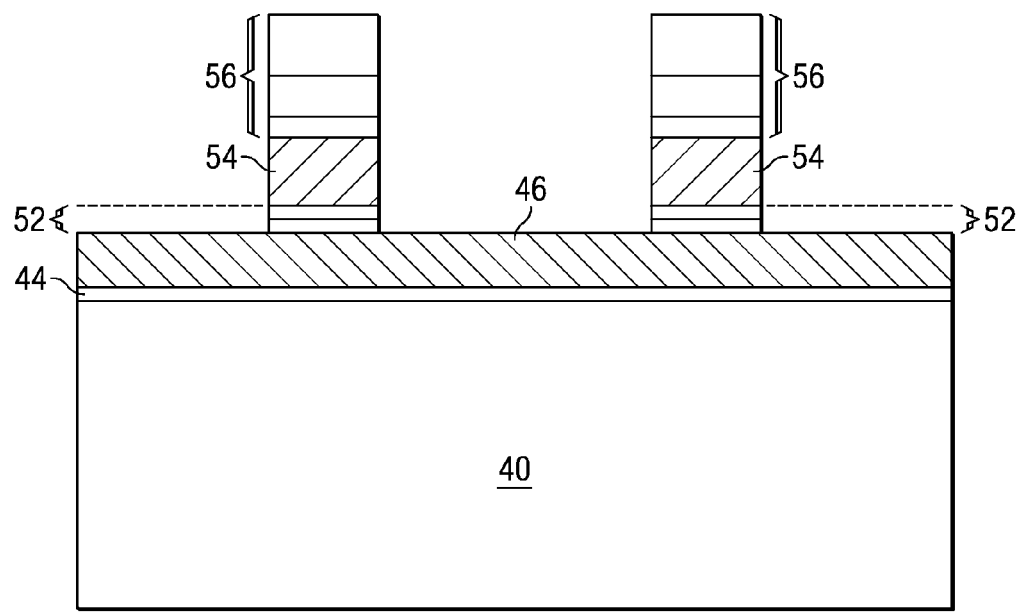
Figure 5C:
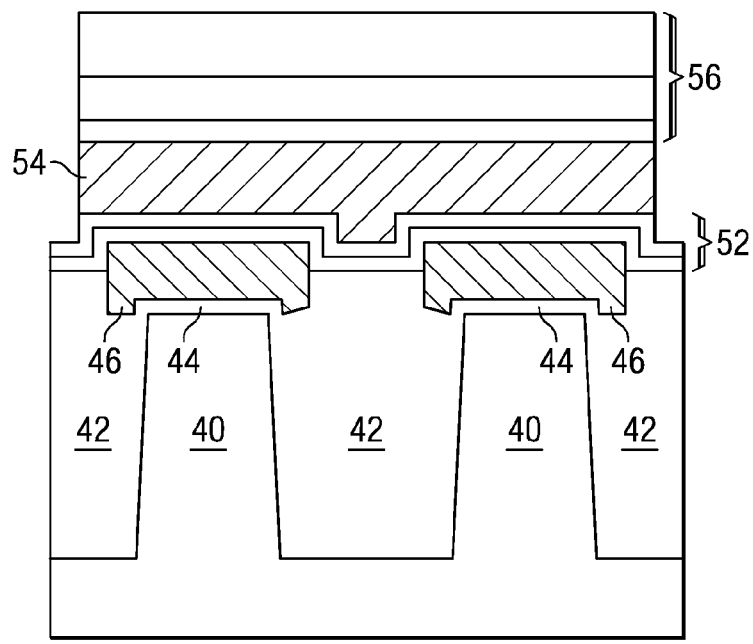

FIGS. 5A, 5B and 5C illustrate the formation of control gates and hard masks. A blocking layer, a control gate layer, and a cap layer are formed sequentially. The blocking layer preferably has an oxide-nitride-oxide (ONO) structure. However, other materials such as a single oxide layer, a single high-k dielectric layer, a single nitride layer, and multi-layers thereof, can also be used. The control layer preferably includes polysilicon, although other conductive materials may also be used. The cap layer may include a bottom anti-reflective coating (BARC) and a photo resist formed on the BARC. Referring to FIG. 5A, the cap layer is first developed and patterned, forming caps 56. The underlying control gate layer and blocking layer are then etched, forming control gates 54 and blocking layers 52, respectfully. Portions of floating gate layer 46 between blocking layers 52 are thus exposed.

Figure 6:
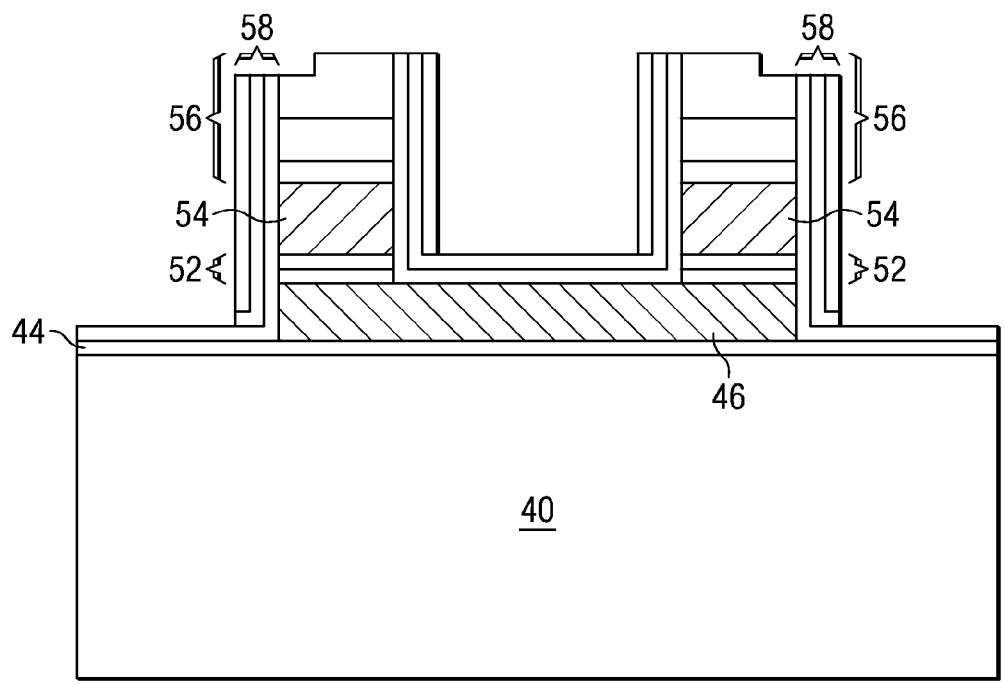

FIG. 6 illustrates the formation of drain-side sidewall spacers 58. First, a photo resist (not shown) is formed to cover caps 56 and the region therebetween. Drain-side portions of floating gate layer 46 are removed by etching. The photo resist is then removed. Sidewall spacers 58 are then deposited and patterned. In an embodiment, sidewall spacers 58 comprise dielectric materials such as tetra-ethyl-ortho-silicate (TEOS), silicon nitride, high temperature oxide (HTO), multi-layers thereof, and combinations thereof. The thickness of sidewall spacers 58 is preferably less than about 300 Å.

Figure 7A:
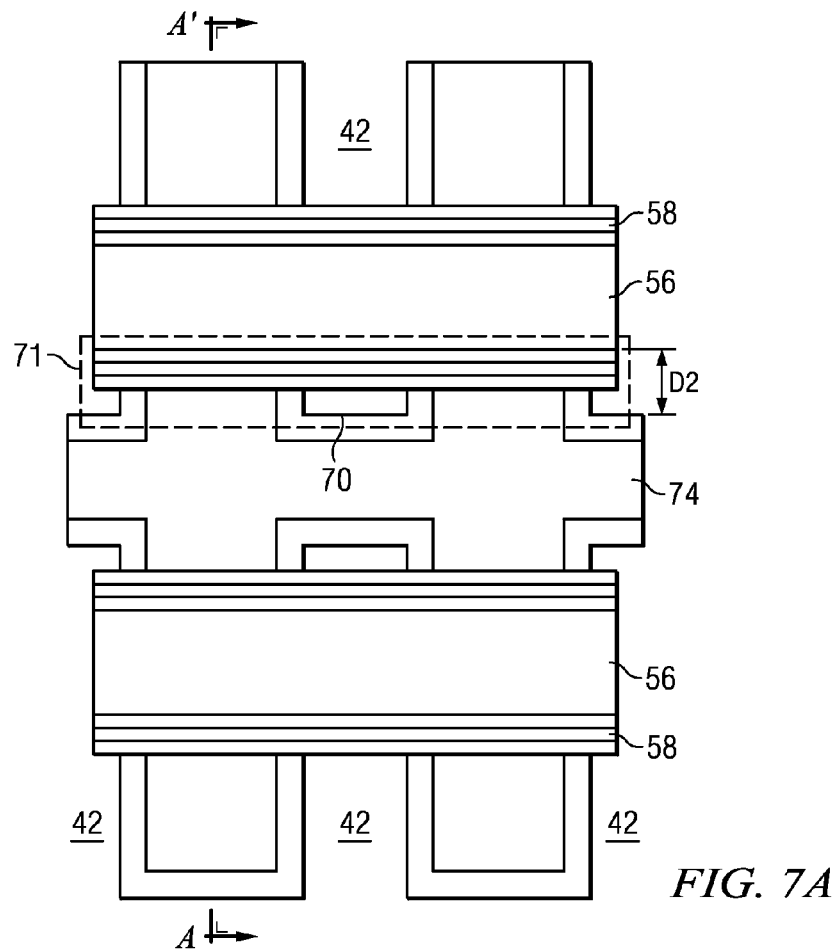
Figure 7B:
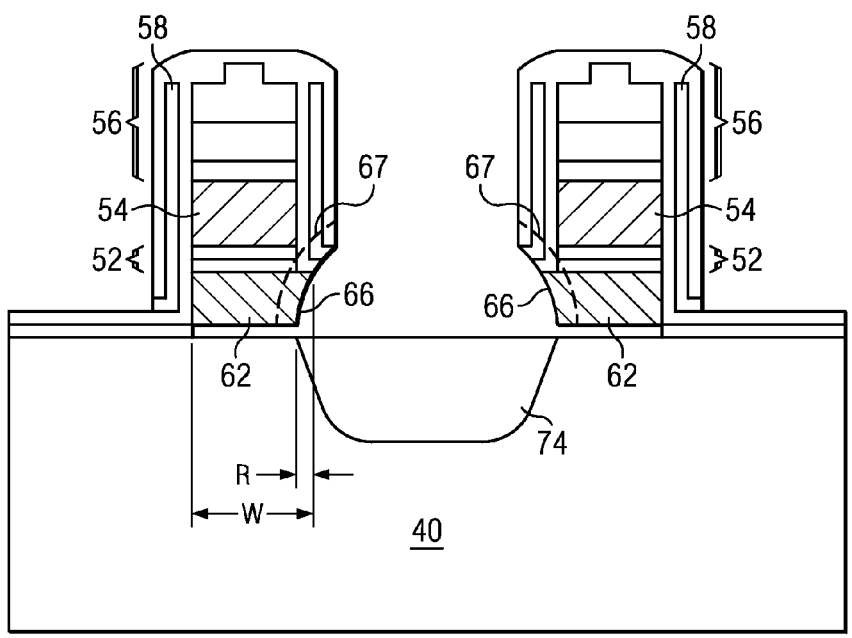

FIGS. 7A and 7B illustrate the formation of common source 74. Preferably, a photo resist is formed, which only exposes a portion of floating gate layer 46 between caps 56, while the remaining portions are covered. The exposed floating gate layer 46 is then etched, forming floating gates 62. In the preferred embodiment, the formation of floating gate layer 46 includes etching floating gates 62 until substantially vertical edges of floating gates 62 are formed, and continuing to over-etch floating gates 62 to further recess their sidewalls, thus forming undercuts. In a first embodiment, lower portions of the edges of floating gates 62 are recessed (undercut) more than the respective upper portions, and hence each floating gate 62 includes a tip 66. Advantageously, during erase operations of the resulting memory cells, tips 66 have high electrical fields, and thus charges are erased faster. In other embodiments, both upper portions and lower portions of the edges of floating gates 62 are recessed. As a result, the sidewalls of floating gates 62 may be recessed more than the respective sidewalls of blocking layers 52. Alternatively, both sidewalls of floating gates 62 and the overlying blocking layers 52 are recessed. If only the lower portions of floating gates 62 are recessed, dry etching is preferably used. Otherwise, wet etching may be used. In an exemplary embodiment, the lower portions of floating gates 62 are recessed by a distance R of more than about 150 Å. In other exemplary embodiment, recess distance R is greater than about 10 percent of width W of floating gates 62. Furthermore, the upper portion of the floating gate may be recessed from the respective edge of the blocking layer for a distance greater than 10 percent of a width of the floating gate.

Comparing FIGS. 7A and 7B, it is found that if floating gates 62 are recessed, the distance D2 (refer to FIG. 7A) between floating gates 62 and the respective edges of STI regions are increased. FIG. 7A also reveals that if a misalignment occurs, and the mask for etching floating gate layer 46 undesirably shifts down so that the floating gate 62 shifts to the position marked by dashed line 71, the floating gate formed on the upper-left leg and upper-right leg of active regions 40 will be shorted by a portion 70 of floating gate layer 46 (refer to FIG. 4A), which is not removed due to the misalignment. However, with floating gate recessed on the side facing common source 74, the likelihood of the shorting of floating gate 62 is reduced. Correspondingly, the overlay window, which measures how far a mask can misalign from other masks without affecting the function and performance of the resulting integrated circuits, is increased.

To form undercuts in floating gates 62, the etching recipe may be adjusted. Preferably, dry etching is performed to undercut lower portions of floating gates 62, thus forming tips 66. In alternative embodiments, etching process conditions may be adjusted. For example, in the embodiment wherein floating gates 62 comprise polysilicon, a ratio of chlorine to HBr in the etchant may be increased to cause more lower portions to be etched than upper portions. In an exemplary embodiment, a ratio of the flow rate of chlorine to the flow rate of HBr is greater than about ⅕. In subsequent steps, an implantation is performed to form common source 74.

Figure 8:
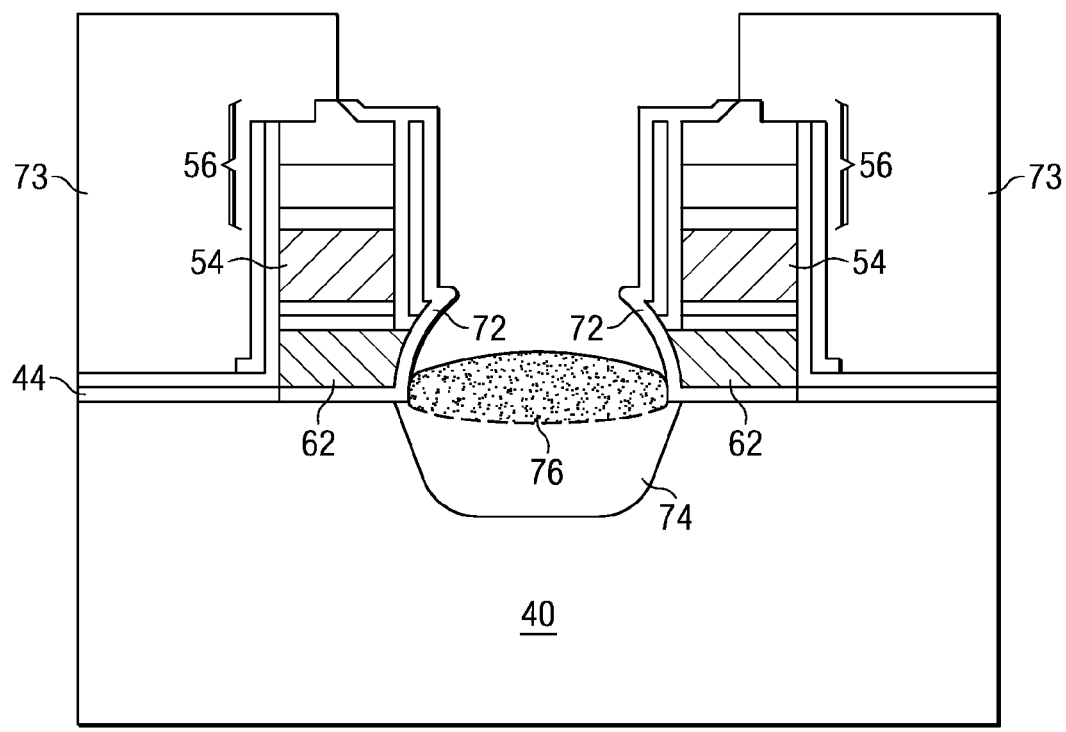

Referring to FIG. 8, mask 73 is formed and patterned. Erase gate inter-poly oxides 72 are then formed to insulate floating gates 62 and subsequently formed erase gates. Inter-poly oxide (IPO) 76, which is used for insulating the subsequently formed erase gate and common source 74 from interacting, is formed. IPO 76 is preferably formed by a thermal oxidation of the surface of common source 74, or by depositing a dielectric layer. Mask 73 is then removed.

Figure 9:
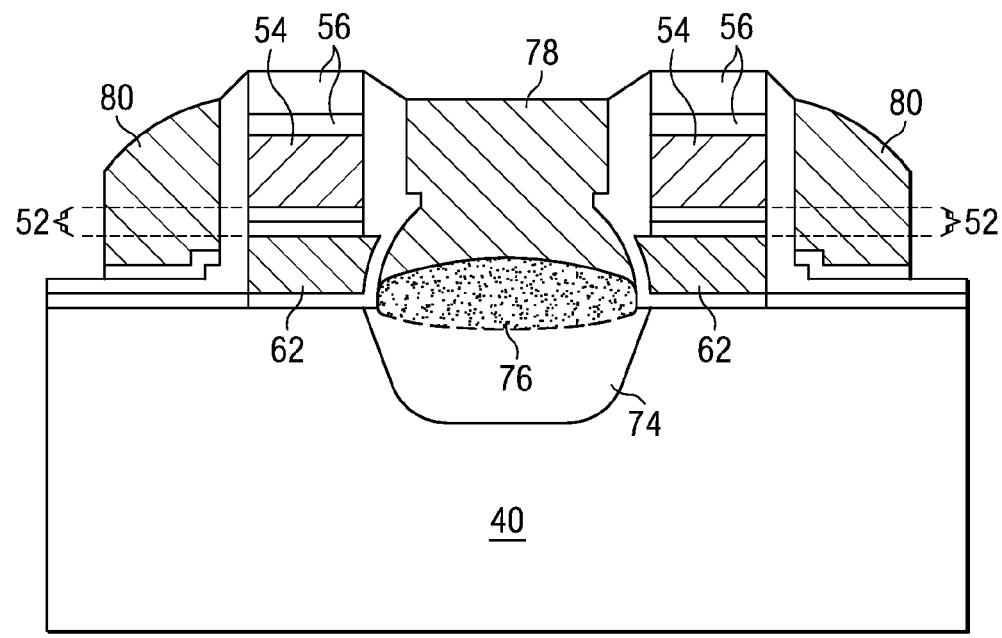

FIG. 9 illustrates the formation of erase gate 78 and word-lines 80. In an embodiment, a conductive material, preferably a polysilicon layer, is blanket formed. A CMP is then performed to remove excess conductive material. The remaining conductive material in the gap between the gate stacks forms erase gate 78. A patterning is then performed to form word-lines 80.

Figure 10A:
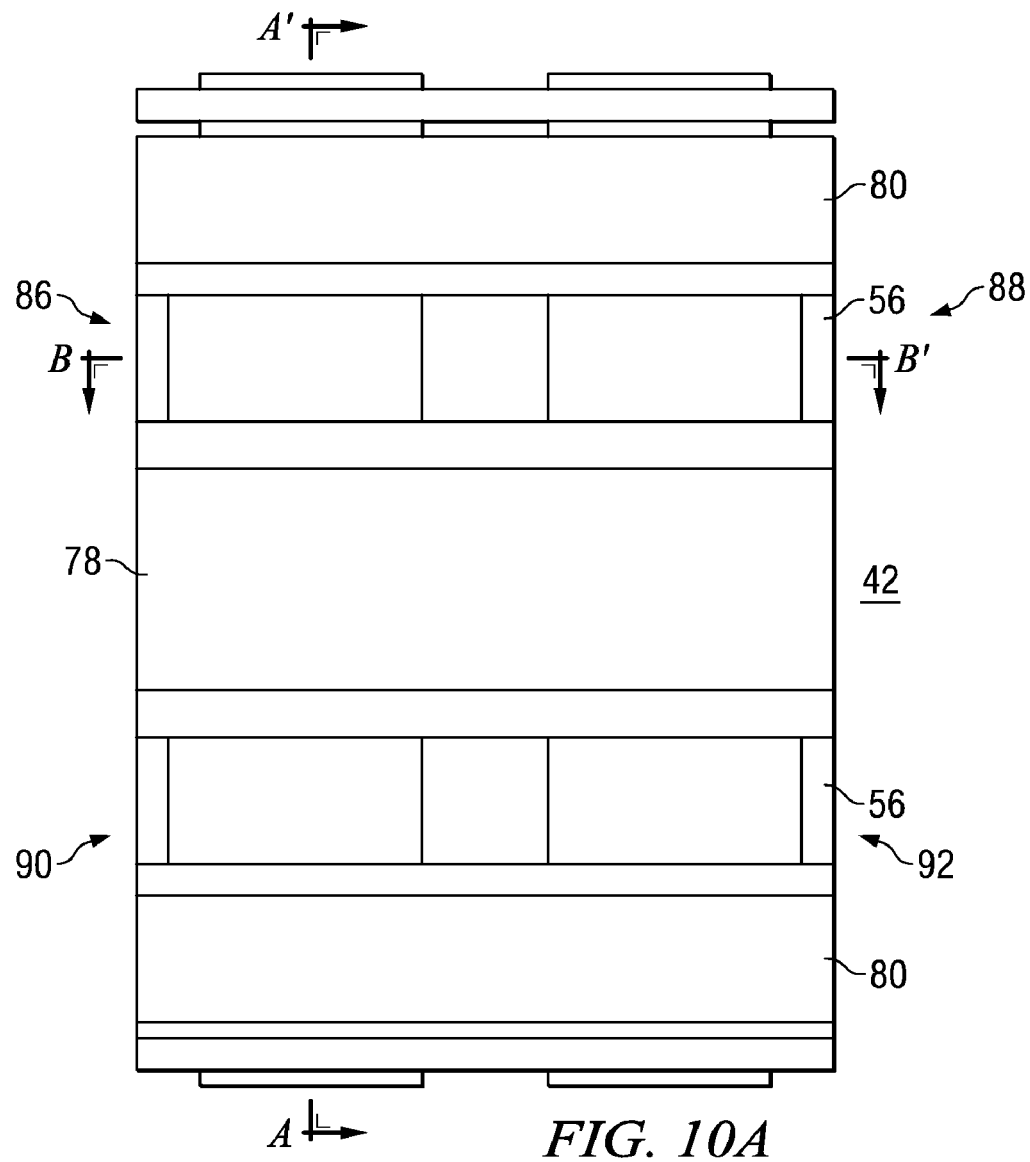
Figure 10B:
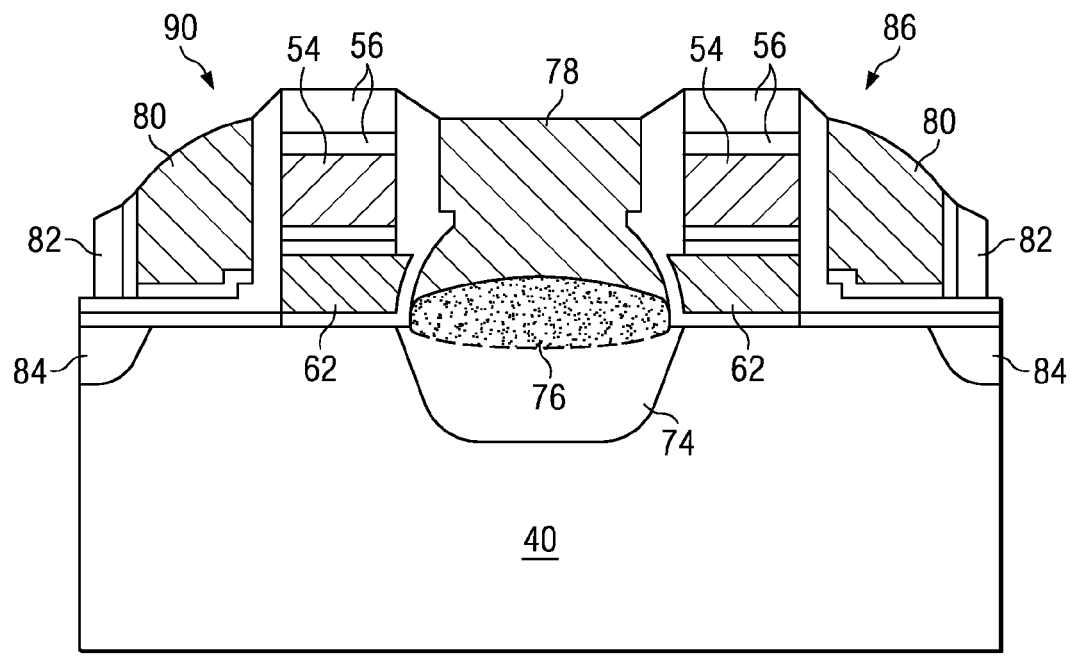
Figure 10C:
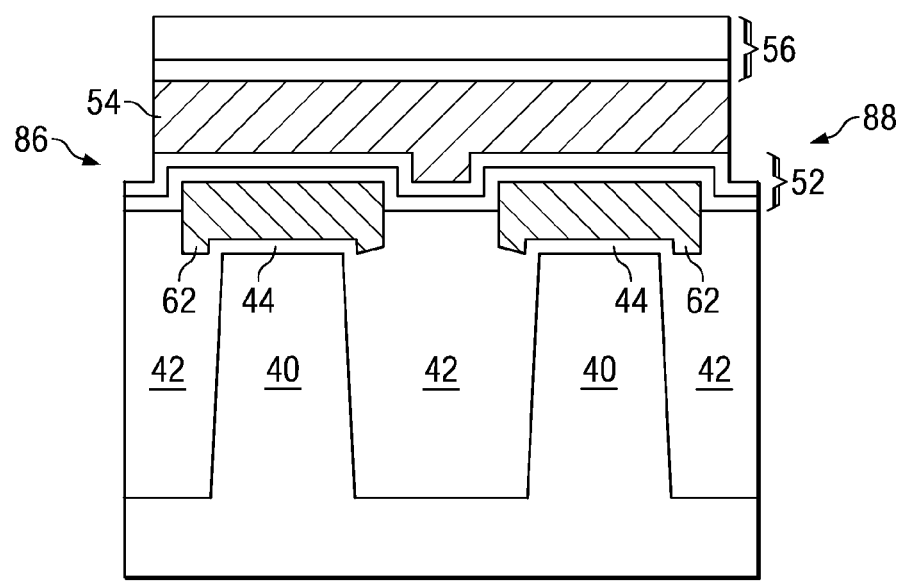

Next, as shown in FIG. 10B, bit-line nodes 84 are formed by an implantation, followed by the formation of word-line spacers 82. The resulting structure is shown in FIGS. 10A, 10B, and 10C.

FIG. 10A illustrates a top view of the resulting structure, which includes four flash memory cells 86, 88, 90 and 92. FIGS. 10B and 10C illustrate cross-sectional views of the structure shown in FIG. 10A, wherein the cross-sectional views are taken along lines A-A' and B-B', respectively. Cells 86 and 90 share common source 74 and common erase gate 78 (refer to FIG. 10B). Cells 86 and 88 share common control gate 54 (refer to FIG. 10C). Similarly, Cells 88 and 92 share a common source and a common erase gate, and cells 90 and 92 share a common control gate.

The preferred embodiments of the present invention have several advantageous features. By recessing floating gates, the likelihood of having shorted floating gates is reduced. The overlay window is also increased. In addition, the erase performance is improved due to the changing of the profile of floating gates 62. Advantageously, no extra masks are needed to achieve the above-discussed improvements.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a semiconductor substrate;
   a tunneling layer on the semiconductor substrate;
   a source region adjacent the tunneling layer;
   a floating gate on the tunneling layer, wherein the floating gate comprises:
      a first edge having an upper portion and a lower portion, wherein the lower portion is recessed from the upper portion;
   a blocking layer on the floating gate, wherein the blocking layer has a first edge facing a same direction as the first edge of the floating gate; and
   a control gate over the blocking layer, wherein the control gate comprises an edge facing the same direction as the first edge of the floating gate, and wherein the first edge of the blocking layer is recessed from the edge of the control gate.

2. The semiconductor structure of claim 1, wherein the first edge of the floating gate and the first edge of the blocking layer face the source region.

3. The semiconductor structure of claim 2, wherein the floating gate further comprises a second, a third, and a fourth edge not facing the source region, and wherein the second, the third and the fourth edges are substantially vertical.

4. The semiconductor structure of claim 2 further comprising:

an additional tunneling layer on the semiconductor substrate, wherein the additional tunneling layer is adjacent to the source region;

an floating gate on the additional tunneling layer, wherein the additional floating gate has a first edge facing the source region; and an additional blocking layer on the additional floating gate, wherein the additional blocking layer has a first edge facing the source region, and wherein the first edge of the additional floating gate has at least a lower portion recessed from an upper portion.

5. The semiconductor structure of claim 1 further comprising:

an inter-poly oxide on the source region;

an erase gate on the inter-poly oxide; and a word-line on an opposite side of the floating gate than the erase gate.

6. The semiconductor structure of claim 1, wherein the lower portion of the first edge of the floating gate is recessed from the first edge of the blocking layer.

7. The semiconductor structure of claim 1, wherein the lower portion is more recessed than the upper portion for a distance of greater than a 10 percent of a width of the floating gate.

8. The semiconductor structure of claim 1, wherein the upper portion of the first edge of the floating gate is recessed from the first edge of the blocking layer for a distance of greater than 10 percent of a width of the floating gate.

9. A semiconductor structure comprising:

a semiconductor substrate;

a first tunneling layer and a second tunneling layer on the semiconductor substrate;

a common source region between the first and the second tunneling layers, wherein the common source region is in the semiconductor substrate;

a first floating gate on the first tunneling layer, wherein the first floating gate has a first sidewall facing the common source region, and wherein a lower portion of the first sidewall of the first floating gate is recessed from an upper portion;

a second floating gate on the second tunneling layer, wherein the second floating gate has a first sidewall facing the common source region, and wherein a lower portion of the first sidewall of the second floating gate is recessed from an upper portion;

a first blocking layer over the first floating gate, wherein the first blocking layer has a sidewall facing the common source region; and a first control gate over the first blocking layer, wherein the first control gate has a sidewall facing the common source region, and wherein the sidewall of the first blocking layer is recessed from the sidewall of the first control gate.

10. The semiconductor structure of claim 9 further comprising a second blocking layer on the second floating gate, wherein the first and the second floating gates each have a tip substantially adjoining the first and the second blocking layers, respectively.

11. The semiconductor structure of claim 10 further comprising a common erase gate between the first and the second floating gates.

12. The semiconductor structure of claim 11, wherein the tips of the first and the second floating gates point to the common erase gate.

13. The semiconductor structure of claim 9, wherein each of the first and the second floating gates further comprises a second, a third and a fourth sidewall not facing the common source region, and wherein the second, the third and the fourth sidewalls of each of the first and the second floating gates are substantially vertical.

14. The semiconductor structure of claim 9, wherein the lower portion of the sidewall of the first floating gate is recessed from the upper portion by a distance of greater than about 10 percent of a width of the first floating gate.

15. A semiconductor structure comprising:

a semiconductor substrate;

a first active region in the semiconductor substrate;

a second active region in the semiconductor substrate, wherein the first and the second active regions are parallel and spaced apart by an insulation region;

a connecting active region perpendicular to the first and the second active regions and connecting a portion of the first active region to a portion of the second active region;

a first tunneling layer on the first active region;

a first floating gate on the first tunneling layer, wherein the first floating gate has a first edge facing the connecting active region, and wherein a bottom portion of the first edge is recessed from a top portion of the first edge;

a second tunneling layer on the second active region;

a second floating gate on the second tunneling layer, wherein the first and the second floating gates are disconnected from each other, and wherein the second floating gate has a second edge facing the connecting active region, and wherein a bottom portion of the second edge is recessed from a top portion of the second edge;

a blocking layer extending from over the first floating gate to over the second floating gate; and a control gate layer on the blocking layer, the control gate layer extending from over the first floating gate to over the second floating gate, wherein each of the blocking layer and the control gate layer comprises an edge facing the connecting active region, and wherein the edge of the blocking layer is recessed from the edge of the control gate layer.

16. The semiconductor structure of claim 15, wherein the blocking layer extends substantially over an edge of the connecting active region, and wherein the first and the second edges of the respective first and the second floating gates are spaced apart from the edge of the connecting active region.

* * * * *